(12) United States Patent
Kamata et al.

(10) Patent No.: US 10,014,064 B2
(45) Date of Patent: Jul. 3, 2018

(54) NON-VOLATILE SEMICONDUCTOR STORAGE DEVICE

(71) Applicant: TOSHIBA MEMORY CORPORATION, Minato-ku, Tokyo (JP)

(72) Inventors: Yoshihiko Kamata, Yokohama Kanagawa (JP); Koji Tabata, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/456,153

(22) Filed: Mar. 10, 2017

(65) Prior Publication Data

US 2017/0186492 A1 Jun. 29, 2017

Related U.S. Application Data

(63) Continuation of application No. PCT/JP2014/074297, filed on Sep. 12, 2014.

(51) Int. Cl.
*G11C 16/10* (2006.01)
*G11C 16/34* (2006.01)
(Continued)

(52) U.S. Cl.
CPC ............ *G11C 16/3459* (2013.01); *G11C 7/08* (2013.01); *G11C 16/0483* (2013.01);
(Continued)

(58) Field of Classification Search
CPC .................................. G11C 16/10; G11C 7/08
(Continued)

(56) References Cited

U.S. PATENT DOCUMENTS

| 6,069,823 A | 5/2000 | Takeuchi et al. |
| 6,172,909 B1 | 1/2001 | Haddad et al. |
(Continued)

FOREIGN PATENT DOCUMENTS

| JP | 2000090675 A | 3/2000 |
| JP | 2007520845 A | 7/2007 |
(Continued)

OTHER PUBLICATIONS

International Search Report (ISR) and Written Opinion dated Nov. 18, 2014 issued in International Application No. PCT/JP2014/074297.

(Continued)

*Primary Examiner* — Michael Tran
(74) *Attorney, Agent, or Firm* — Holtz, Holtz & Volek PC

(57) ABSTRACT

According to one embodiment, a semiconductor storage device includes a memory cell array having memory cell capable of holding N-bit data; and a sense amplifier comprising a first latch holding information on a threshold distribution, a second latch holding write data, and a third latch holding lower information of the N-bit data, and supplying a first to a fourth voltages to the memory cell to write the data to the memory cell using the first to fourth voltages. The sense amplifier supplies the first to third voltages to the memory cell based on information in the second and the third latches, and based on a result of transfer of the information held by the first latch to the second latch, supplies the fourth voltage or the first voltage to the memory cell.

4 Claims, 11 Drawing Sheets

(51) Int. Cl.
  *G11C 16/26* (2006.01)
  *G11C 16/08* (2006.01)
  *G11C 16/04* (2006.01)
  *G11C 7/08* (2006.01)

(52) U.S. Cl.
  CPC .............. *G11C 16/08* (2013.01); *G11C 16/10* (2013.01); *G11C 16/26* (2013.01)

(58) Field of Classification Search
  USPC ............................................. 365/185.22, 205
  See application file for complete search history.

(56) References Cited

U.S. PATENT DOCUMENTS

| | | | |
|---|---|---|---|
| 6,307,785 | B1 | 10/2001 | Takeuchi et al. |
| 2003/0016566 | A1 | 1/2003 | Yamaki et al. |
| 2003/0043621 | A1 | 3/2003 | Wong |
| 2004/0042294 | A1 | 3/2004 | Guterman et al. |
| 2005/0162916 | A1 | 7/2005 | Guterman et al. |
| 2008/0106946 | A1 | 5/2008 | Inoue et al. |
| 2008/0225618 | A1 | 9/2008 | Hosono et al. |
| 2009/0267128 | A1 | 10/2009 | Maejima |
| 2009/0268522 | A1 | 10/2009 | Maejima |
| 2010/0080060 | A1* | 4/2010 | Chen ................... G11C 16/34 365/185.12 |
| 2010/0207195 | A1 | 8/2010 | Fukuzumi et al. |
| 2011/0284946 | A1 | 11/2011 | Kiyotoshi |
| 2012/0008411 | A1 | 1/2012 | Banks |
| 2012/0155177 | A1* | 6/2012 | Wang ..................... G11C 16/28 365/185.17 |
| 2013/0051147 | A1 | 2/2013 | Iwai |
| 2013/0058177 | A1* | 3/2013 | Seshadri ................. G11C 29/50 365/201 |
| 2013/0343124 | A1 | 12/2013 | Ma et al. |
| 2014/0146616 | A1* | 5/2014 | Marmiroli .............. G11C 16/26 365/185.22 |
| 2014/0153346 | A1* | 6/2014 | Roy ....................... G11C 11/419 365/189.15 |
| 2014/0157065 | A1* | 6/2014 | Ong ....................... G11C 29/12 714/718 |
| 2014/0244864 | A1* | 8/2014 | Shiga ................... G11C 29/1201 710/5 |
| 2015/0098279 | A1* | 4/2015 | Chen ....................... G11C 7/08 365/189.06 |
| 2015/0170746 | A1* | 6/2015 | Oowada ................. G11C 16/10 365/185.18 |
| 2016/0180957 | A1* | 6/2016 | Nishiyama ........ G11C 16/0408 365/185.21 |

FOREIGN PATENT DOCUMENTS

| | | |
|---|---|---|
| JP | 2008117471 A | 5/2008 |
| JP | 2013045478 A | 3/2013 |
| JP | 2014006940 A | 1/2014 |

OTHER PUBLICATIONS

Taiwanese Office Action dated May 16, 2016 issued in counterpart Taiwanese Application No. 104106724.

English translation of the International Preliminary Report on Patentability (IPRP) dated Mar. 14, 2017 issued in counterpart International Application No. PCT/JP2014/074297.

* cited by examiner

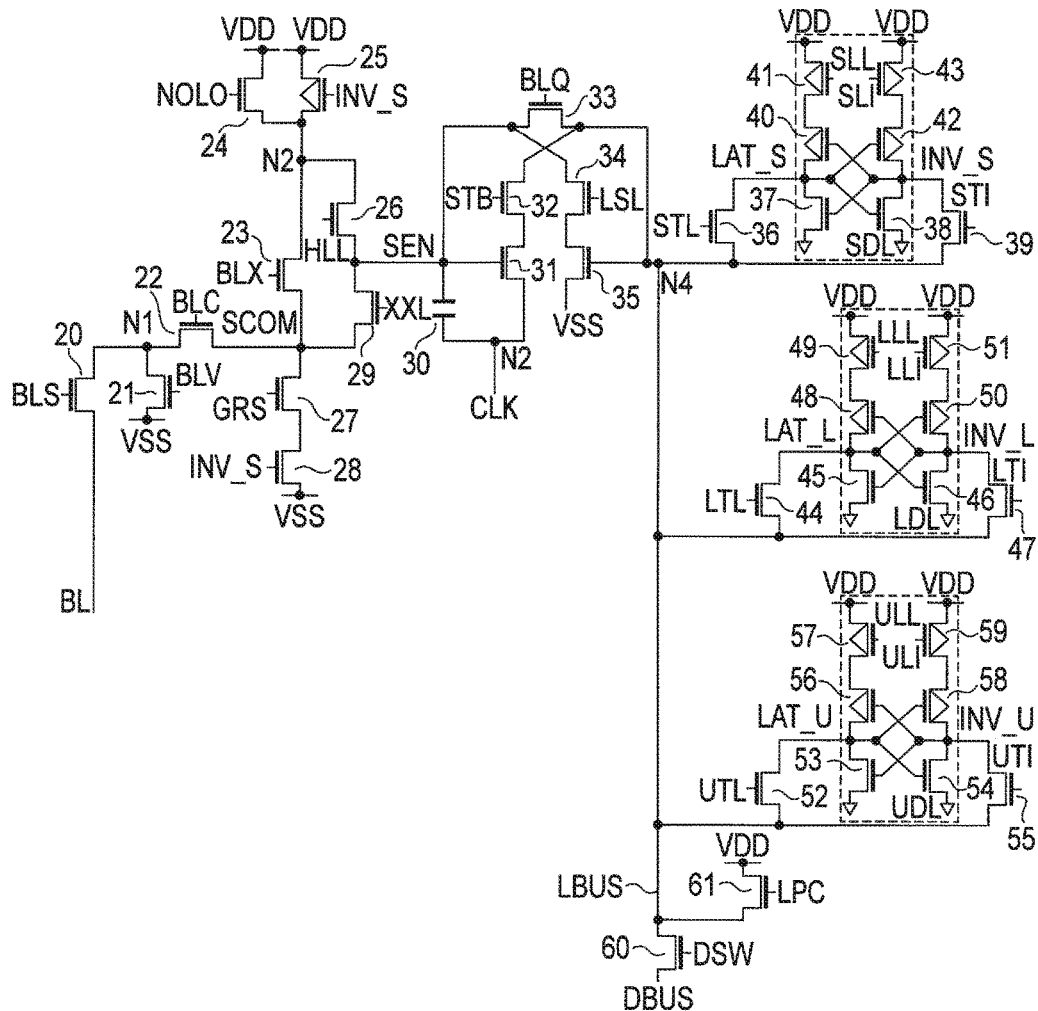
F I G. 3

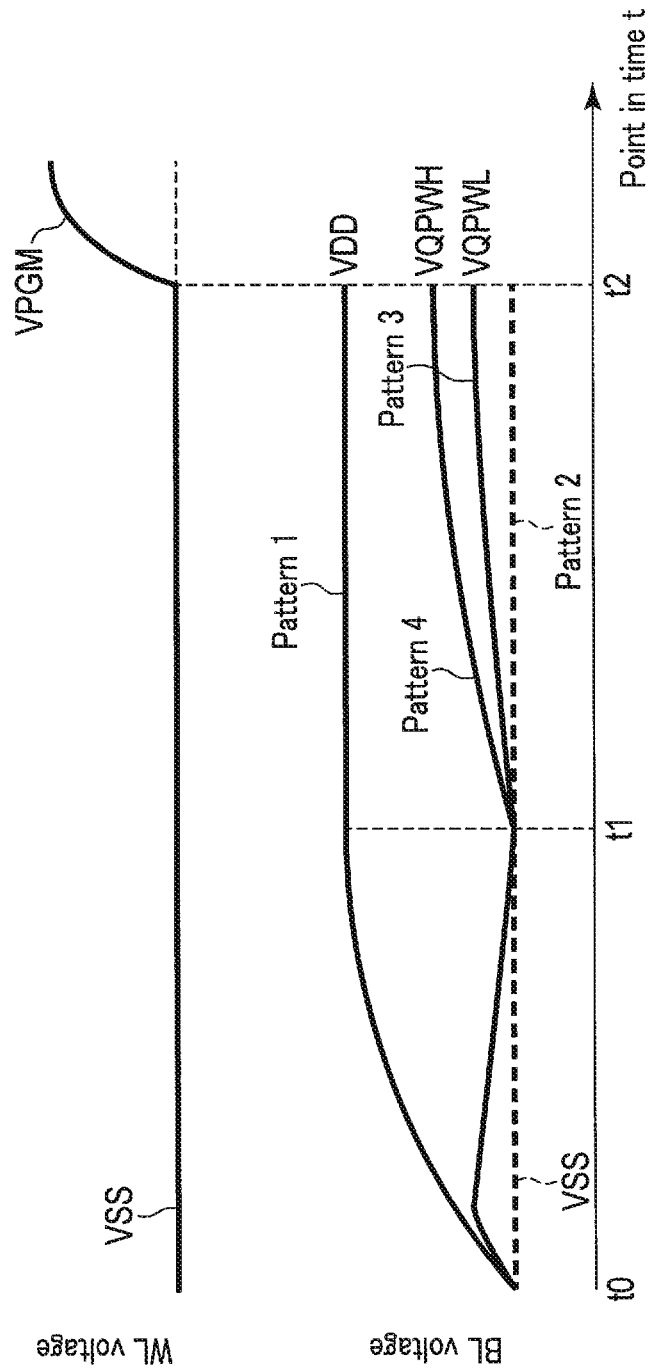
F I G. 4A

|   |     | UDL<br>LAT_U | INV_U |
|---|-----|------|------|
| E | 111 | 1 | 0 |
| A | 011 | 0 | 1 |
| B | 001 | 0 | 1 |
| C | 101 | 1 | 0 |
| D | 100 | 1 | 0 |
| E | 000 | 0 | 1 |
| F | 010 | 0 | 1 |
| G | 110 | 1 | 0 |

FIG. 9A

| MDL<br>LAT_M | INV_M | LDL<br>LAT_L | INV_L |
|---|---|---|---|
| 1 | 0 | 1 | 0 |
| 1 | 0 | 1 | 0 |
| 0 | 1 | 1 | 0 |
| 0 | 1 | 1 | 0 |
| 0 | 1 | 0 | 1 |
| 0 | 1 | 0 | 1 |
| 1 | 0 | 0 | 1 |
| 1 | 0 | 0 | 1 |

FIG. 9B

|   | After passing E level | | |
|---|---|---|---|
|   | PASS | Fail | First write target |
| E | VDD | - | - |
| A | VDD | - | - |
| B | VDD | - | - |
| C | VDD | - | - |
|   |   |   |   |
| D | VDD | - | - |
| E | VDD | - | - |
| F | VDD | VQPWL | VPQWH |
| G | VDD | VSS | VPQWH |

F I G. 9E

NON-VOLATILE SEMICONDUCTOR STORAGE DEVICE

CROSS-REFERENCE TO RELATED APPLICATIONS

This application is a Continuation Application of PCT Application No. PCT/JP2014/074297, filed Sep. 12, 2014, the entire contents of which are incorporated herein by reference.

FIELD

Embodiments relate to a non-volatile semiconductor storage device.

BACKGROUND

NAND flash memory includes memory cells arranged in a matrix and a sense amplifier that allows the memory cells to hold write data.

BRIEF DESCRIPTION OF THE DRAWINGS

FIG. 3 is a circuit diagram of a sense amplifier according to the first embodiment;

FIG. 4A is a conceptual drawing illustrating voltage patterns provided by the sense amplifier according to the first embodiment;

FIG. 9A is a conceptual drawing of data held by a latch circuit according to a second embodiment;

FIG. 9B is a conceptual drawing of data held by the latch circuit according to the second embodiment;

FIG. 9E is a conceptual drawing of the write voltages supplied by the sense amplifier based on the verify result according to the second embodiment.

DETAILED DESCRIPTION

Figure 1:
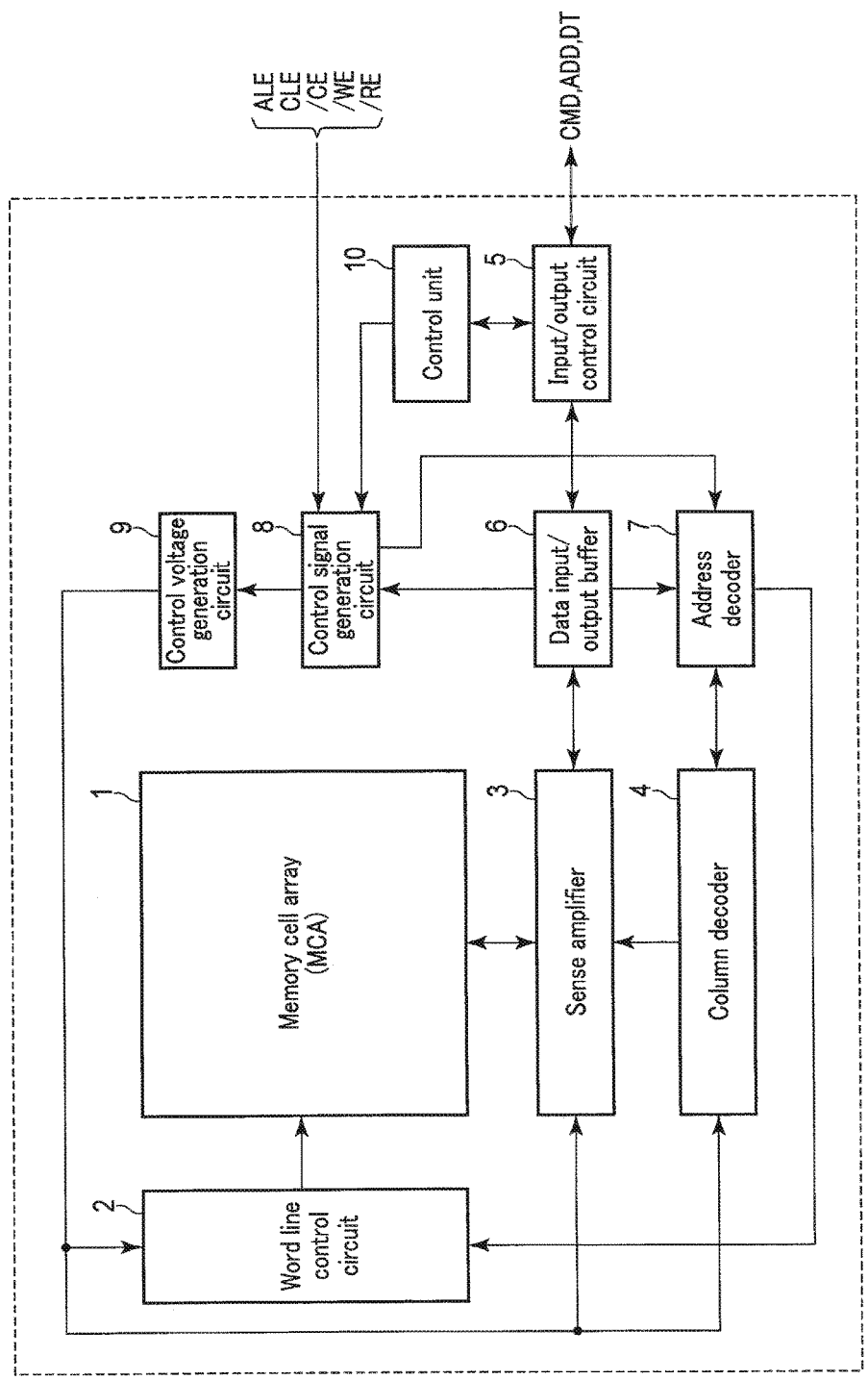
FIG. 1 is a diagram of an example of a general configuration of a non-volatile semiconductor storage device according to a first embodiment.

The present embodiments will be described below with reference to the drawings. For the description, common components are denoted by common reference numerals throughout the drawings.

In general, according to one embodiment, a non-volatile semiconductor storage device includes a memory cell array having memory cells which are arranged in a matrix along a bit line direction and a word line direction and each of which is capable of holding N-bit (N: natural number) data; and. a sense amplifier comprising a first latch capable of temporarily holding information on a threshold distribution, a second latch capable of holding write data, and a third latch capable of holding lower information of the N-bit data, the sense amplifier capable of supplying a first to a fourth voltages to each of the memory cells to write the data to the memory cell using the first to fourth voltages. The sense amplifier supplies the first to third voltages to the memory cell based on information held by the second latch and the third latch, and then, based on a result of transfer of the information held by the first latch to the second latch, supplies the fourth voltage, the first voltage, or the third voltage to the memory cell.

In the present embodiments, a sense amplifier selectively supplies one of four types of write voltages to a bit line BL as needed.

The four types of voltages include three types of voltages used to transition a threshold of memory cells to a desired threshold distribution ("A" state, "B" state, "C" state) and a first voltage used to shift a lower tail of each of the threshold distributions to a positive side.

The first voltage is a voltage that reduces a threshold distribution width by raising the lower tail of the threshold distribution.

In other words, the first voltage allows the distribution width of each threshold distribution to be reduced.

Write using the first voltage may be hereinafter referred to as first write. Furthermore, write using the above-described three types of voltages may be hereinafter referred to as second write.

First Embodiment

General Configuration Example

A general configuration of a non-volatile semiconductor storage apparatus according to a first embodiment will be described using FIG. 1.

As depicted in FIG. 1, the non-volatile semiconductor storage apparatus according to the first embodiment includes a memory cell array 1 (represented as MCA in the drawings), a word line control circuit 2, a sense amplifier 3, a column decoder 4, an input/output control circuit 5, a data input/output buffer 6, an address decoder 7, a control signal generation circuit 8, a control voltage generation circuit 9, and a control unit 10. First, the memory cell array 1 will be described.

Memory Cell Array 1

In FIG. 1, the memory cell array 1 includes non-volatile memory cells MC each of which can hold, for example, data for two or more values.

A control gate of each memory cell MC is connected to a word line WL, and one end of the memory cell MC is connected to a bit line BL. The memory cell array 1 will be described below in detail.

Details of the Memory Cell Array MC

Figure 2:
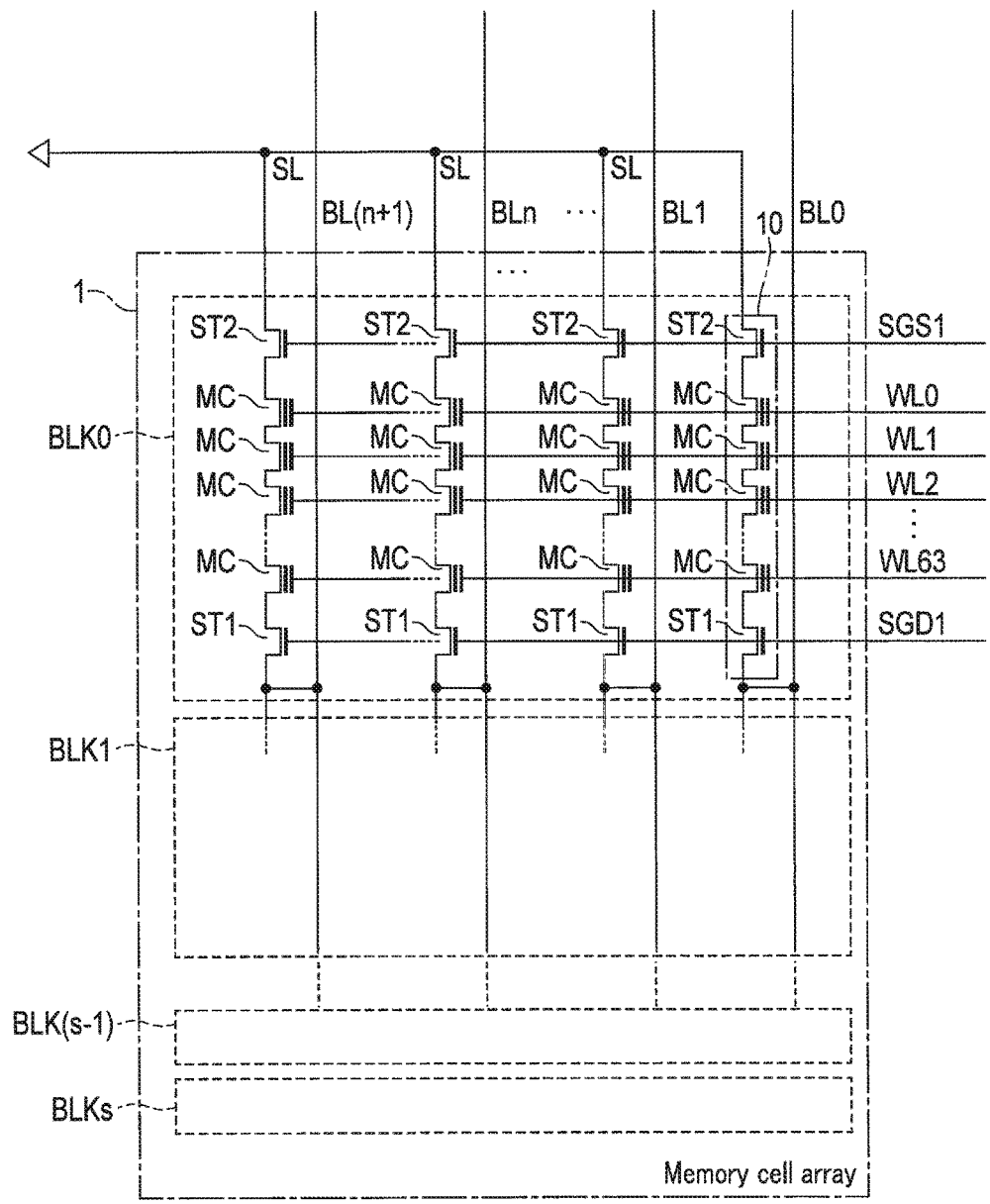
FIG. 2 is a plan view of a memory cell array according to the first embodiment.

Now, as depicted in FIG. 2, blocks BLK0 to BLKs each include a plurality of NAND strings 11 in each of which the non-volatile memory cells MC are connected together in series. Each of the NAND strings 11 includes, for example, 64 memory cells MC and selection transistors ST1, ST2.

The memory cell MC is of a MONOS structure having a charge storage layer (for example, an insulating film) formed on a semiconductor substrate via a gate insulating film, an insulating film (hereinafter referred to as a block layer) formed on the charge storage layer and having a larger dielectric constant than the charge storage layer, and a control gate electrode formed on the block layer. The number of the memory cells MC is not limited to 64 but may be 64, 128, 256, or the like and the number of the memory cells MC is not limited.

The adjacent memory cells MC share a source and a drain. The memory cells MC are arranged such that current paths in the memory cells MC are connected together in series between the selection transistors ST1, ST2. A drain area at one side of the series connected memory cells MC is connected to a source area of the selection transistor ST1 and a source area at the other side is connected to a drain area of the selection transistor ST2.

Control gate electrodes of the memory cells MC on the same row are all connected to one of word lines WL0 to WL63, and gate electrodes of the selection transistors ST1, ST2 for the memory cells MC on the same row are all connected select gate lines SGD1, SGS1, respectively.

For simplification of description, when not distinguished below from one another, the word lines WL0 to WL63 may be collectively referred to as word lines WL. In the memory cell array 1, drains of the selection transistors ST1 on the same column are all connected to one of bit lines BL0 to BLn.

When not distinguished below from one another, the bit lines BL0 to BLn are collectively referred to as bit lines BL (n: natural number). Sources of the selection transistor ST2 are all connected to a source line SL. Not both the selection transistors ST1, ST2 are needed but one of the selection transistors ST1, ST2 may be exclusively provided so long as the single selection transistor allows selection of the NAND string 11.

Furthermore, data is written at once to a plurality of the memory cells MC connected to the same word line WL, and this unit is referred to as a page. Moreover, data is erased from a plurality of the NAND strings 11 at once in units of blocks BLIP.

Each of the memory cells MC in the present embodiment can hold any one of, for example, four values (2 bits).

An "E" state is referred to as an erase state and refers to a state where no charge is present in the charge storage layer. When charge is stored in the charge storage layer, a threshold voltage increases.

For a plurality of the memory cells MC, when the memory cells MC are distributed according to the amount of charge stored in the memory cell MC, the threshold distribution is divided into "A" state, a "B" state, and a "C" state.

Four thresholds correspond to the "E" state, the "A" state, the "B" state, and the "C" state in order of increasing voltage.

Here, the "E" state is designated as "11", the "A" state is designated as "10", the "B" state is designated as "01", and the "C" state is designated as "00".

When the held data is represented as "☐Δ", "☐" is referred to as an upper bit, and during data write, stored in UDL described below, "Δ" is referred to as a lower bit, and during write, stored in LDL described below.

The configuration of the memory cell array 1 is not limited to the above-described configuration but may be a configuration described in U.S. patent application Ser. No. 12/407,403 filed on Mar. 19, 2009 and entitled "Three-dimensional Stacked Non-volatile Semiconductor Memory". The configuration may be one described in U.S. patent application Ser. No. 12/406,524 filed on Mar. 18, 2009 and entitled "Three-dimensional Stacked Non-volatile Semiconductor Memory", U.S. patent application Ser. No. 12/679,991 filed on Mar. 25, 2010 and entitled "Non-volatile Semiconductor Storage Device and Manufacturing Method therefor", and U.S. patent application Ser. No. 12/532,030 filed on Mar. 23, 2009 and entitled "Semiconductor Memory and Manufacturing Method therefor". These patent applications are incorporated herein in its entirety by reference.

Word Line Control Circuit 2

With reference back to FIG. 1, peripheral circuits will be described.

A word line control circuit 2 functions as a row decoder. That is, the word line control circuit 2 selects a row direction in the memory cell array 1 and transfers a voltage generated by the control voltage generation circuit 9 to the memory cells MC provided in the selected block BLK.

Sense Amplifier 3

Now, a sense amplifier 3 will be described. The sense amplifier 3 can be connected to the bit lines BL in the memory cell array 1. The sense amplifier 3 has a function to write and read data to and from the memory cells MC.

Furthermore, the sense amplifier 3 checks whether to supply the above-described first voltage to the bit line BL, and when needed, supplies the first voltage to the bit line BL. To determine whether to supply the first voltage to the bit line, the sense amplifier 3 performs a verify operation using two verify voltages before and after a write operation in order to determine whether or not a predetermined threshold distribution has been closer to a target distribution.

Column Decoder 4

The column decoder 4 outputs a column selection signal that selects from the bit lines in the memory cell array 1 in accordance with an output signal from the address decoder 7.

Input/Output Control Circuit 5

The input/output control circuit 5 receives various commands, address signals, and write data supplied by host equipment not depicted in the drawings.

During data write, the input/output control circuit 5 supplies write data to the sense amplifier 3 via the data input/output buffer 6.

Furthermore, the input/output control circuit 5 outputs data read via the data input/output buffer 6 to the host equipment not depicted in the drawings.

Moreover, the input/output control circuit 5 supplies an address signal to the data input/output buffer 6. The address signal is supplied to the address decoder 7.

The input/output control circuit 5 supplies a command to the data input/output buffer 6. The command is subsequently supplied to the control signal generation circuit 8.

Address Decoder 7

The address decoder 7 receives the address signal supplied by the data input/output buffer 6. The address decoder 7 decodes the address signal and then supplies the decoded address signal to the word line control circuit 2 and the column decoder 4.

Control Signal Generation Circuit 8

The control signal generation circuit 8 receives external control signals such as a chip enable signal /CE, a write enable signal /WE, a read enable signal /RE, an address latch enable signal ALE, and a command latch enable signal CLE from the host not depicted in the drawings.

Based on the above-described external control signal and command supplied in accordance with an operation mode, the control signal generation circuit 8 generates a control signal that controls a sequence of data write and erase and a control signal that controls read of data. The control signal is supplied to the control voltage generation circuit 9 and the address decoder

Control Voltage Generation Circuit 9

In accordance with various control signals supplied by the control signal generation circuit 8, the control voltage generation circuit 9 generates voltages needed for various operations of the memory cell array 1, the sense amplifier circuit 3, and the column decoder 4 such as a read voltage, a write voltage, and a verify voltage.

Control Unit 10

The control unit 10 controls the non-volatile semiconductor storage device as a whole. For example, the control unit uses a command received from the host not depicted in the drawings to control operational timings for a write operation, write verify, and the like.

Specifically, the control unit 10 controls turn-on and -off of each of the transistors included in the sense amplifier 3 and timings for the turn-on and -off and performs data calculation, the supply of voltages to bit line BL, and a change in the route of the voltage supply.

Details of the Sense Amplifier 3

Now, using FIG. 3, the sense amplifier 3 will be described in detail. The sense amplifier 3 includes n-channel type MOS transistors 20 to 29, 31 to 39, 44 to 47, 52 to 55, 60, 61, p-channel type MOS transistors 40 to 43, 48 to 51, 56 to 59, and a capacitor element 30.

As described above, the control unit 10 controls the voltage level of the signal supplied to the gate of each transistor, the timing for the supply, and the like.

Furthermore, the reference numeral of a MOS transistor is added to a threshold voltage Vth of the MOS transistor to represent the threshold voltage of the MOS transistor. For example, the threshold voltage of the MOS transistor 22 is represented as Vth22.

One end of the MOS transistor 20 is connected to the bit line BL. The other end of the MOS transistor 20 is connected to a node N1 so that the node supplies a signal BLS to the MOS transistor 20 through this end. The signal BLS is set to an "H" level at the time of a read operation or a write operation to enable the bit line BL to be connected to the sense amplifier 3.

One end of the MOS transistor 21 is connected to the node N1, the other end of the MOS transistor 21 is grounded (voltage VSS), and a gate of the MOS transistor 21 is supplied with a signal BLV.

One end of the MOS transistor 22 is connected to the node N1, the other end of the MOS transistor 22 is connected to SCOM, and a gate of the MOS transistor 22 is supplied with a signal BLC. The signal BLC is a signal for clamping the bit line BL to a predetermined potential.

For example, when the signal BLC=(VDD+Vth22) is provided to the MOS transistor 22 during the write operation, the MOS transistor 22 enables a voltage up to a voltage VDD to be supplied to the bit line BL.

Therefore, the MOS transistor 22 can supply a voltage VSS, a voltage VQPWL, a voltage VQPWH, and the like described below to the bit line BL.

A relation "voltage VDD>voltage VQPWH>voltage VQPWL>voltage VSS" is established.

One end of the MOS transistor 23 is connected to SCOM, the other end of the MOS transistor 23 is connected to a node N2, and a gate of the MOS transistor 23 is supplied with a signal BLX (for example, either a voltage (VDD+Vth23) or a voltage (VQPWH+Vth23) during the write operation).

One end of the MOS transistor 24 is supplied with the voltage VDD, the other end of the MOS transistor 24 is connected to the node N2, and a gate of the MOS transistor 24 is supplied with NOLO.

Moreover, one end of the MOS transistor 25 is supplied with the voltage VDD, the other end of the MOS transistor 25 is connected to the node N2, and a gate of the MOS transistor 25 is supplied with a signal. INV_S. The voltage level of the signal INV_S varies in accordance with data held by SDL described below.

For example, when SDL holds "1" as write data, the voltage level of INV_S is "L", and when SDL holds "0" as write data, the voltage level of INV_S is "H".

When the voltage level of INV_S is "L", the sense amplifier 3 supplies the voltage VDD to the bit line BL.

One end of the MOS transistor 27 is connected to the node SCOM, and a gate of the MOS transistor 27 is supplied with a signal ORS.

One end of the MOS transistor 28 is connected to the other end of the MOS transistor 27, a gate of the MOS transistor 28 is supplied with INV_S, and the other end of the MOS transistor 28 is supplied with the ground potential (VSS).

When the above-described signal INV_S="H" level, the sense amplifier 3 supplies the voltage VSS to the bit line BL via the MOS transistor 28.

One end of the MOS transistor 29 is connected to SCOM, and the other end of the MOS transistor 29 is connected to a node N3.

Furthermore, one end of the MOS transistor 26 is connected to the node N3, the other end of the MOS transistor 26 is connected to the node N2, and a gate of the MOS transistor 26 is supplied with a signal HLL.

One electrode of the capacitor element 30 is supplied with a clock CLK by a node N2, and the other electrode of the capacitor element 30 is connected to a node SEN.

One end of the MOS transistor 31 is connected to the node N2, and a gate of the MOS transistor 31 is supplied with the signal SEN. In other words, the MOS transistor 31 is turned on and off depending on the potential of the node SEN. Therefore, the MOS transistor 31 and the node SEN may be collectively referred to as a sensing unit.

One end of the MOS transistor 32 is connected to the other end of the MOS transistor 31, the other end of the MOS transistor 32 is connected to the node N4, and a gate of the MOS transistor 32 is supplied with a signal STE. For example, when the voltage level of SEN is transferred to SDL, the signal STB is set to "H". The transferred data is inverted, but this enables data transfer from SEN to SDL.

One end of the MOS transistor 33 is connected to the node SEN, the other end of the MOS transistor 33 is connected to the node N4, a gate of the MOS transistor 33 is supplied with a signal BLQ (voltage (VDD+Vth30)).

One end of the MOS transistor 34 is connected to the node SEN, and a gate of the MOS transistor 34 is supplied with a signal LSL. Furthermore, one end of the MOS transistor 35 is connected to the other end of the MOS transistor 34, the other end of the MOS transistor 35 is grounded (voltage VSS), and a gate of the MOS transistor 35 is connected to the node N4.

SDL

SDL holds write data.

Specifically, SDL holds the data in a node LAT_S. For example, for "1" write, the voltage level of LAT_S is the "H" level (="1" data).

In contrast, for "0" write, the voltage level of LAT_S is the "L" level (="0" data). Consequently, for example, 0 V or the voltage VDD is transferred to the node SEN in accordance with the write data.

The configuration will be described below.

One end of the MOS transistor 36 is connected to the node N4, the other end of the MOS transistor 36 is connected to the node LAT_S, and a gate of the MOS transistor 36 is supplied with a signal STL.

One end of the MOS transistor 39 is connected to the node N4, the other end of the MOS transistor 39 is connected to IN_S, and a gate of the MOS transistor 39 is supplied with a signal STI.

One end of the MOS transistor 37 is connected to LAT_S, the other end of the MOS transistor 37 is supplied with the ground potential, and a gate of the MOS transistor 37 is supplied with the signal INV_S.

Furthermore, one end of the MOS transistor 38 is connected to INV_S, the other end of the MOS transistor 38 is supplied with the ground potential, and a gate of the MOS transistor 38 is connected to the signal LAT_S.

One end of the MOS transistor 40 is connected to LAT_S, and a gate of the MOS transistor 40 is supplied with the signal INV_S.

Furthermore, one end of the MOS transistor 42 is connected to INV_S, and a gate of the MOS transistor 42 is supplied with the signal LAT_S.

The MOS transistors 37, 38, 40, and 42 are a group of transistors intended to transfer a predetermined voltage to the bit line BL, and function as a latch circuit (hereinafter referred to as SDL).

One end of the MOS transistor 41 is supplied with the voltage VDD, the other end of the MOS transistor 41 is connected to the other end of the MOS transistor 40, and a gate of the MOS transistor 41 is supplied with a signal SLL.

One end of the MOS transistor 43 is supplied with the voltage VDD, the other end of the MOS transistor 43 is connected to the other end of the MOS transistor 42, and a gate of the MOS transistor 43 is supplied with a signal SLI.

Data in the node SEN is stored in SDL via the MOS transistor 36 or the MOS transistor 39.

LDL

Now, LDL will be described.

LDL holds lower bit data.

Components different from the corresponding components of SDL will be described below.

The difference lies in signal names. Specifically, LDL is different from SDL in that "STL" is changed to "LTL" and "INV_S" is changed to "INV_L". This also applies to the following signals.

The MOS transistors 45, 46, 48, and 50 are a group of transistors intended to transfer a voltage corresponding to the lower bit to the bit line BL.

UDL

Now, UDL will be described.

UDL holds higher bit data.

Components different from the corresponding components of SDL will be described below.

The difference lies in signal names. Specifically, UDL is different from SDL in that "STL" is changed to "UTL" and "INV_S" is changed to "INV_U". This also applies to the following signals.

The MOS transistors 53, 54, 56, and 58 are a group of transistors intended to transfer a voltage corresponding to the upper bit to the bit line BL.

An interconnect to which a node N4 is connected is referred to as LBUS, and the MOS transistor 61 has a function to charge LBUS.

Furthermore, one end of the MOS transistor 60 is connected to DBUS, the other end of the MOS transistor 60 is connected to the node N4, and a gate of the MOS transistor 60 is supplied with a signal DSW.

In accordance with the signal DSW, the MOS transistor 60 is turned on or off to transfer write data from XDL connected to the interconnect DBUS and not depicted in the drawings.

Time Chart

Now, using FIG. 4A and FIG. 4B, a voltage pattern of voltages supplied to the bit line BL by the sense amplifier 3 during the write operation will be described.

Figure 4B:
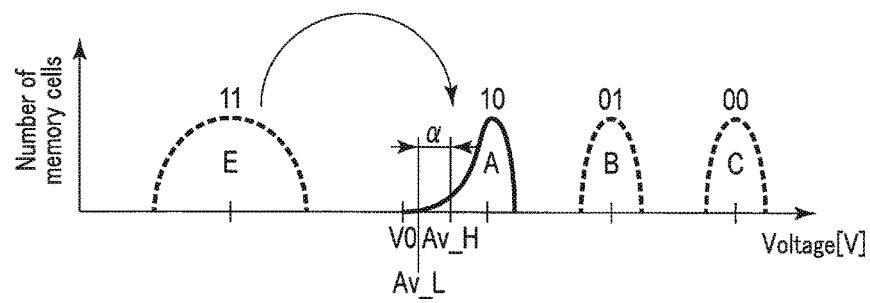
FIG. 4B is a conceptual drawing illustrating a threshold distribution of memory cells according to the first embodiment.

FIG. 4A depicts a time chart illustrating a write operation following a write verify operation using two verify voltages (for example, Av_L, Av_H as depicted in FIG. 4B; a region between Av_L, Av_H may be hereinafter referred to as a region α).

The verify voltages (Av_L, Av_H) are voltages used to check for memory cells MC for which the threshold distribution has not reached the A state but for which supply of a voltage in a pattern 4 described below to the bit line BL allows the threshold distribution to reach the A state. Furthermore, a relation Av_H >Av_L is established.

Pattern 1: Non-write (E State is Maintained)

As illustrated in the figure, in a pattern 1, the sense amplifier 3 starts supplying a voltage to the bit line BL at a point in time t0 to increase the voltage of the bit line BL to the voltage VDD by a point in time t1. At this time, charge corresponding to the voltage VDD is held in the bit line BL.

Therefore, at and after the point in time t1, the bit line BL maintains the voltage VDD.

At the point in time t0, a voltage Vsg (>voltage VDD) is supplied to the signal SGD. Then, the selection transistor ST1 is turned on to increase the potential of a channel of the NAND string 11 to the voltage VDD.

Then, from the point in time t1 to a point in time t1', the value of the signal SGD is changed to voltage Vsg=>voltage Vsgd (<voltage Vsg). Consequently, the selection transistor T1 is cut off.

Moreover, at the point in time t1', the word line control circuit 2 increases the potential of the unselected word lines WL to a voltage VPASS. In conjunction with the increase in the potential, a channel potential is boosted from the voltage VDD due to coupling.

In other words, at and after a point in time t2, the word line control circuit 2 increases the potential of the selected word line WL to a write voltage VPGM.

However, a small difference between the channel voltage and the voltage of the word line WL precludes injection of charge to keep the threshold distribution of the memory cells MC in the "E" state. In other words, the pattern 1 corresponds to a voltage that implements non-write.

For a pattern 2 and a pattern 3, second write is adopted.

Pattern 2: Write (Write for Shifting to B or C State)

In the pattern 2, at and after the point in time t0, the sense amplifier 3 supplies the ground potential (VSS) to the bit line BL.

Subsequently, the word line control circuit 2 supplies the write voltage VPGM to the selected word line WL.

In other words, the pattern 2 is a voltage pattern in which charge is injected into the charge storage layer in the memory cell MC to raise the threshold distribution to the B state or the C state.

Pattern 3: Write (Write for Shifting to A State)

In the pattern 3, at and after the point in time t0, the sense amplifier 3 supplies the ground potential (VSS) to the bit line BL.

Subsequently, at the point in time t1, the sense amplifier 3 supplies the voltage VQPWL to the bit line BL. Consequently, the voltage of the bit line BL increases from the voltage VSS to the voltage VQPWL. Subsequently, the word line control circuit 2 supplies the write voltage VPGM to the selected word line WL.

In other words, the pattern 3 makes the potential difference between the control gate and channel in the memory cell MC smaller than the pattern 2. Therefore, the pattern 3 allows less charge to be injected into the charge storage layer in the memory cell MC than the pattern 2.

Pattern 4: Write (First Write)

In the pattern 4, at and after the point in time t0, the sense amplifier 3 supplies the voltage VDD to the bit line BL.

Subsequently, at the point in time t1, the sense amplifier 3 switches the voltage to be supplied to the bit line BL from the voltage VDD to the voltage VQPWH. Subsequently, the word line control circuit 2 supplies the write voltage VPGM to the selected word line WL.

In other words, the pattern 4 makes the potential difference between the control gate and channel in the memory cell MC smaller than the pattern 3. Therefore, the pattern 4 allows less charge to be injected into the charge storage layer in the memory cell MC than the pattern 3.

Using the pattern 4 in this manner achieves first write that raises the threshold distribution positioned slightly below the A state to the A state.

In the present embodiment, to supply the voltage in the pattern 4 to the bit line BL, SEN is allowed to temporarily function as a latch unit. In other words, SEN is allowed to hold information indicating whether or not to supply the voltage in the pattern 4 to the bit line BL.

When the sense amplifier 3 supplies the voltage in the pattern 4 to the bit line BL, the voltage level of SEN is set to "H".

Consequently, the present embodiment enables the first write to be achieved.

Operation of the Sense Amplifier

Now, using FIGS. 5 to 7, in the sense amplifier 3 during the voltage transfer described above with reference to FIG. 4A, and the operation of the sense amplifier 3 which supplies the bit line BL with the voltages in the patterns 1 to 4, that is, the voltage VDD, the voltage VSS, the voltage VQPWL, and the voltage VQPWH, will be described.

As described above, in the present embodiment, the target state into which the threshold distribution is precisely formed by executing write is the "A" state, by way of example. That is, the operation is an example in which the width of the threshold distribution in the "A" state is reduced.

Furthermore, the first write is executed on each of the lower and upper bits.

Here, an example is illustrated where write is executed until the threshold distribution in the "A" state is completed and where the write of the lower bit is focused on.

Figure 5:
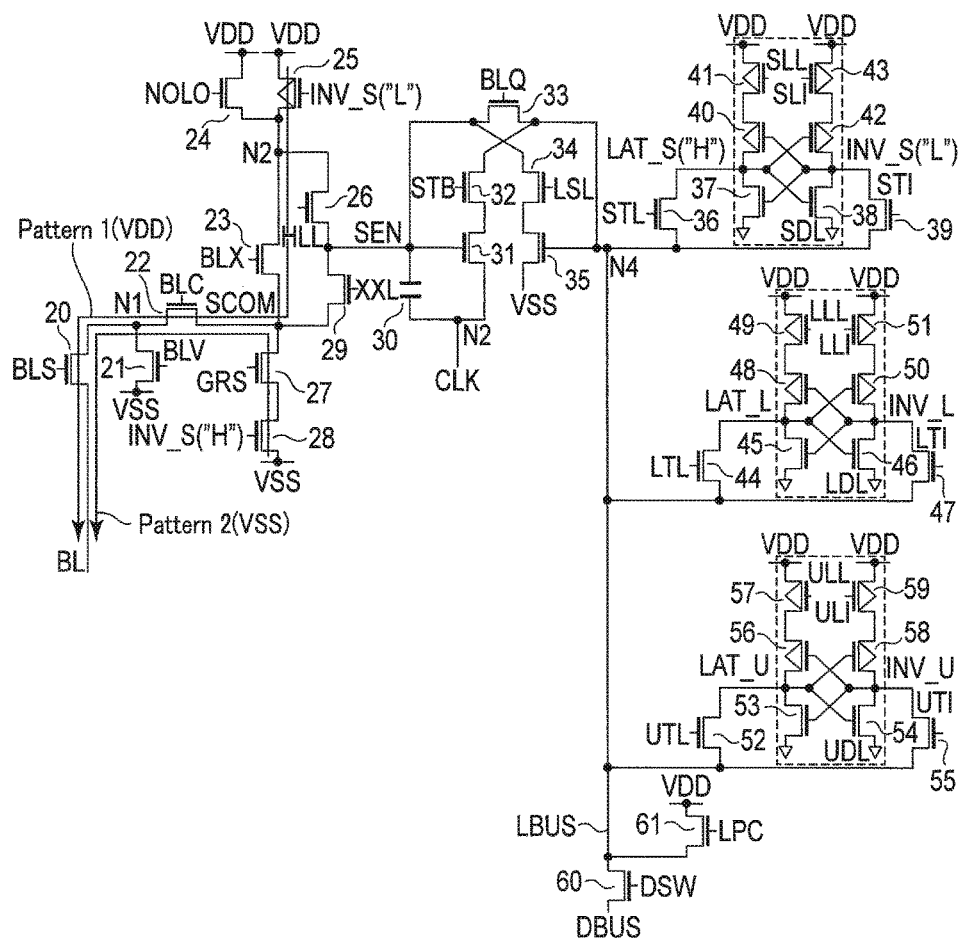
FIG. 5 is a conceptual drawing illustrating a sense amplifier operation during write according to the first embodiment.

As depicted in FIG. 5, the sense amplifier 3 supplies the bit line BL with a voltage that varies in accordance with the data held by SDL.

For example, when the data held by SDL(LAT_S) is indicative of "H" level, that is, non-write, INV_S="L" level.

Therefore, in this case, the MOS transistor 25 is turned on, and the sense amplifier 3 supplies the voltage VDD to the bit line BL via the MOS transistor 25, the MOS transistor 23, the MOS transistor 22, and the MOS transistor 20 (FIG. 4A: pattern 1).

Figure 7A:
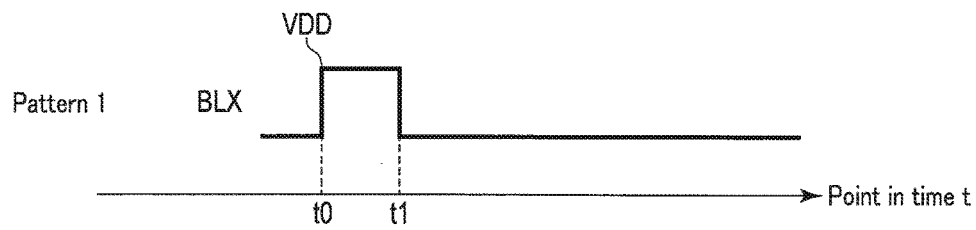
FIG. 7A is a time chart illustrating an operational timing for a transistor according to the first embodiment.

At this time, at the point in time t0, the control unit 10 sets the voltage level of the signal BLX to a voltage VX2 (>voltage VDD) as depicted in FIG. 7A.

In contrast, for example, when the data held in SDL is indicative of the "L" level, that is, write (for shifting to one of the A to C states), INV_S="H" level.

Therefore, the MOS transistor 25 is turned off, whereas the MOS transistor 28 is turned on. Thus, the sense amplifier 3 supplies the around potential, that is, the voltage VSS to the bit line BL via the MOS transistor 27, the MOS transistor 22, and the MOS transistor 20 (FIG. 4A: patterns 2 to 4).

Figure 7B:
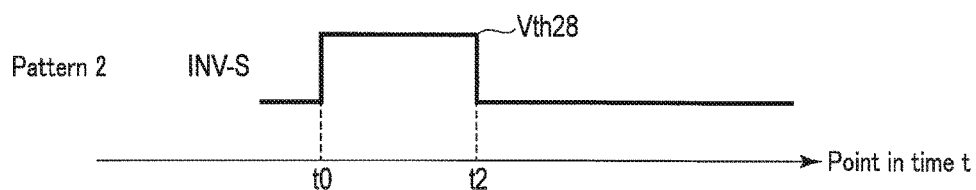
FIG. 7B is a time chart illustrating an operational timing for the transistor according to the first embodiment.

At this time, at the point in time t0, the voltage level of the signal GRS and the signal. INV_S are set to the voltage VDD as depicted in FIG. 7B.

Furthermore, the voltage level of a signal XXL is changed from the voltage VSS to a voltage (Vth29+VQPWL) at the point in time t1.

Subsequently, the control unit 10 transfers, to SDL, a voltage pre-stored in the node SEN, that is, a voltage level indicating whether or not the memory cell MC is positioned between the two verify voltages (Av_L and Av_H), that is, in the region α.

Figure 6:
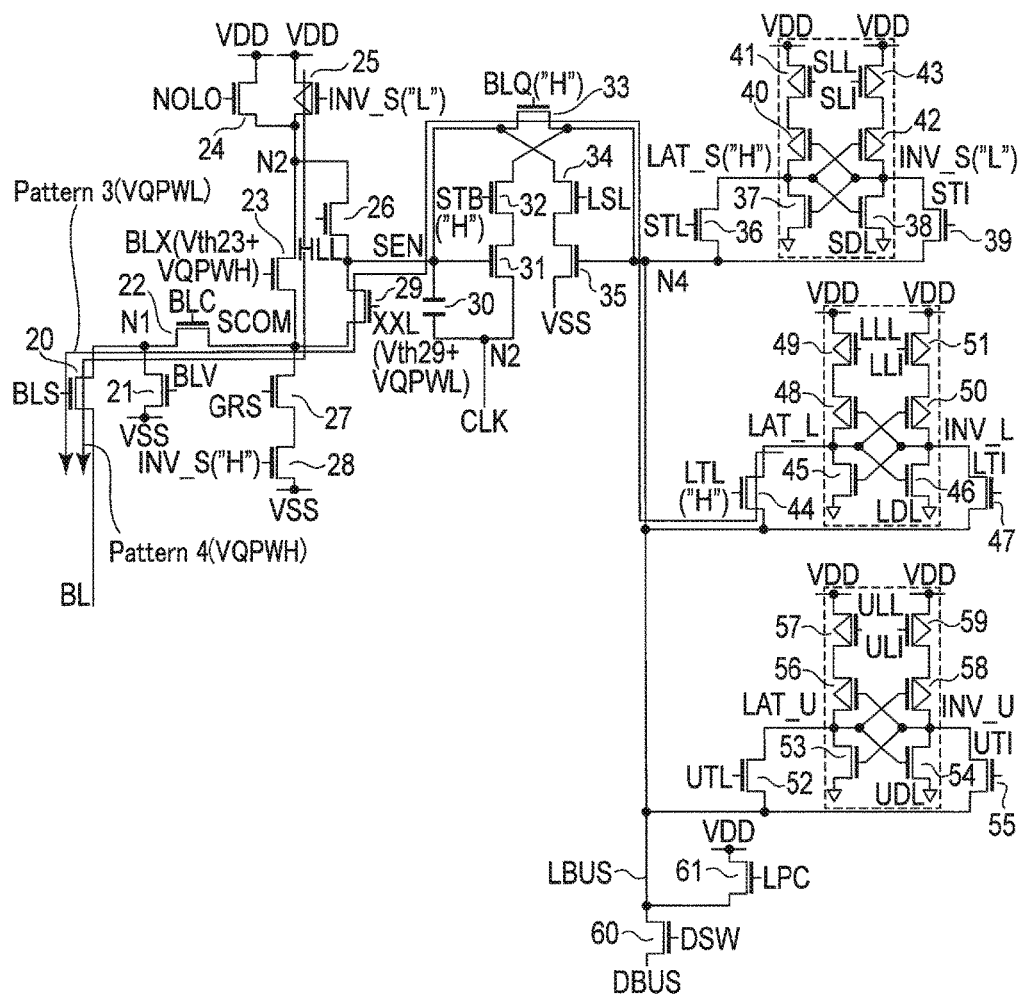
FIG. 6 is a conceptual drawing illustrating a sense amplifier operation during write according to the first embodiment.

Specifically, as depicted in FIG. 6, the control unit 10 sets each of the signal STB and the signal STI to the "H" level and turns on or off the MOS transistor 31 in accordance with the voltage level of the node SEN to transfer the voltage level of the node SEN to SDL.

Therefore, turn-on of the MOS transistor 31 allows the around potential to be transferred to INV_S, whereas turn-off of the MOS transistor 31 keeps the voltage of INV_S at the current voltage level.

Here, when the voltage level of the node SEN is the "H" level, that is, (I) when the transfer of SEN=>SDL results in the voltage level of INV_S being set to "L", the threshold for the write target memory cell MC is positioned between Av_L and Av_H.

In this case, the sense amplifier 3 supplies the voltage in the above-described pattern 4 to the bit line BL. Specifically, the sense amplifier 3 supplies the voltage VQPWH to the bit line BL via the MOS transistor 25, the MOS transistor 23, the MOS transistor 22, and the MOS transistor 20 (pattern 4, FIG. 4A).

Figure 7C:
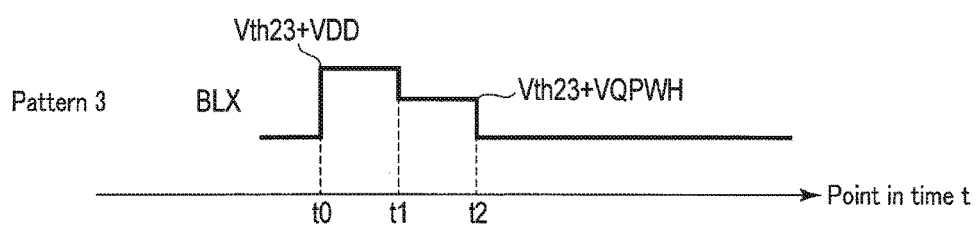
FIG. 7C is a time chart illustrating an operational timing for the transistor according to the first embodiment.
Figure 7D:
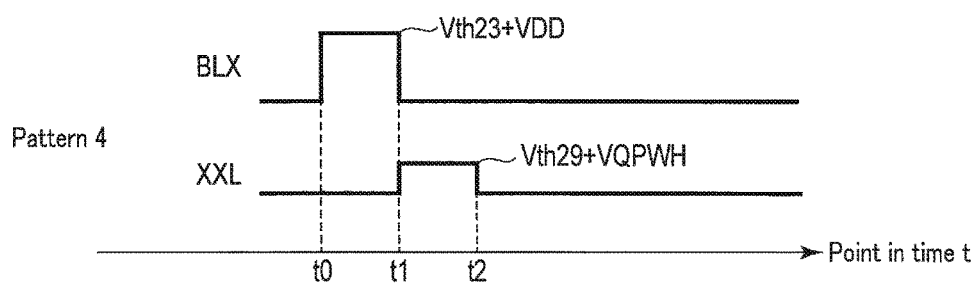
FIG. 7D is a time chart illustrating an operational timing for the transistor according to the first embodiment.

At this time, as depicted in FIG. 7D, the voltage level of the signal BLX is switched from the voltage VX2 to a voltage (Vth23+VQPWH) at the point in time t1.

Furthermore, at the point in time t1, the control unit 10 switches the voltage levels of the signal GRS and the signal INV_S from the voltage VDD to the voltage VSS.

(II) When the transfer of SEN=>SDL results in the voltage level of INV_S being set to "H", the above-described voltage supply route and a signal GRS route are deactivated. Thus, the sense amplifier 3 supplies the write voltage to the bit line BL through an LDL=>SEN route.

Specifically, the sense amplifier 3 supplies the bit line BL with the write Voltage corresponding to the data in LDL holding the lower bit.

For example, when the write is executed so as to complete the threshold distribution in the B state or the C state, since the lower bit is "0", the voltage level held by LDL (LAT_L) is "L". Therefore, the voltage level of INV_L is set to "L".

In this case, as depicted in FIG. 6, the control unit 10 sets the voltage levels of the signal LTL, the signal BLQ, the signal XXL, and the signal BLC to "H", and the sense amplifier 3 supplies the potential of LDL, the ground potential to the bit line BL.

In contrast, when the write is executed so as to complete the threshold distribution in the A state, since the lower bit is "1", the voltage level held by LDL is "H". Therefore, the voltage level of INV_L is "H".

In this case, as depicted in FIG. 6, the control unit 10 sets the voltage level of the signal XXL to (VQPWL+Vth29), and the sense amplifier 3 supplies the voltage VQPWL to the bit line BL (pattern 3, FIG. 4A).

That is, as depicted in FIG. 7C, the voltage levels of the signal GRS and the signal INV_S are changed from the voltage VDD to the voltage VSS at the point in time t1, and at the same point in time t1, the voltage level of the signal XXL is set to a voltage (Vth29+VQPWL).

Subsequently, program verify is repeated, and when no memory cell MC exhibits a threshold distribution positioned in the region α, an operation similar to the above-described operation (first write) is performed on the upper bit to complete the threshold distribution in the "A" state.

Once the threshold distribution in the "A" state is completed, the control unit 10 then executes similar processing on a memory cell MC for which the threshold distribution in the "B" state is to be completed. That is, program verify is performed using the two verify voltages (Bv_L and Bv_H (>Bv_L): this region is hereinafter referred to as a region β), and the control unit 10 performs a write operation similar to the above-described write operation until no memory cell MC exhibits a threshold distribution positioned in the region β.

In this case, the control unit 10 allows LDL to store the lower bit in the "B" state to supply the voltage VQPWL to the bit line BL as needed.

Once the threshold distribution in the B state is completed, similar processing is executed on a memory cell MC for which the threshold distribution in the "C" state is to be completed.

Effects of the First Embodiment

The non-volatile semiconductor storage device according to the first embodiment can produce the following effect (1).

(1) A predetermined threshold distribution width can be reduced.

As described above, in the non-volatile semiconductor storage device according to the present embodiment, the sense amplifier 3 can use four voltage supply routes and thus supply one of the four types of write voltages to the bit line BL as needed.

This is because the node SEN is allowed to function as a dynamic latch that temporarily stores data and LDL is allowed to store the lower bit of the threshold distribution as described above.

Thus, in the write operation for the lower bit, the voltage VQPWH can be used for the first write, and for example, the width of the threshold distribution in the "A" state (lower bit) can be reduced.

Using UDL as described above enables a reduction in threshold distribution width for the upper bit.

The present embodiment focuses on the threshold distribution in the "A" state. However, the present embodiment is not limited to this but enables a reduction in the width of the threshold distribution in the "B" state and in the "C" state.

Modifications

Now, a non-volatile semiconductor storage device according to a modification of the first embodiment will be described.

The non-volatile semiconductor storage device according to the modification is different from the non-volatile semiconductor storage device in the above-described first embodiment in that the memory cell MC holds 3-bit (8-value) data and that the sense amplifier 3 is further provided with MDL described below.

1. Configuration

Sense Amplifier 3

Figure 8:
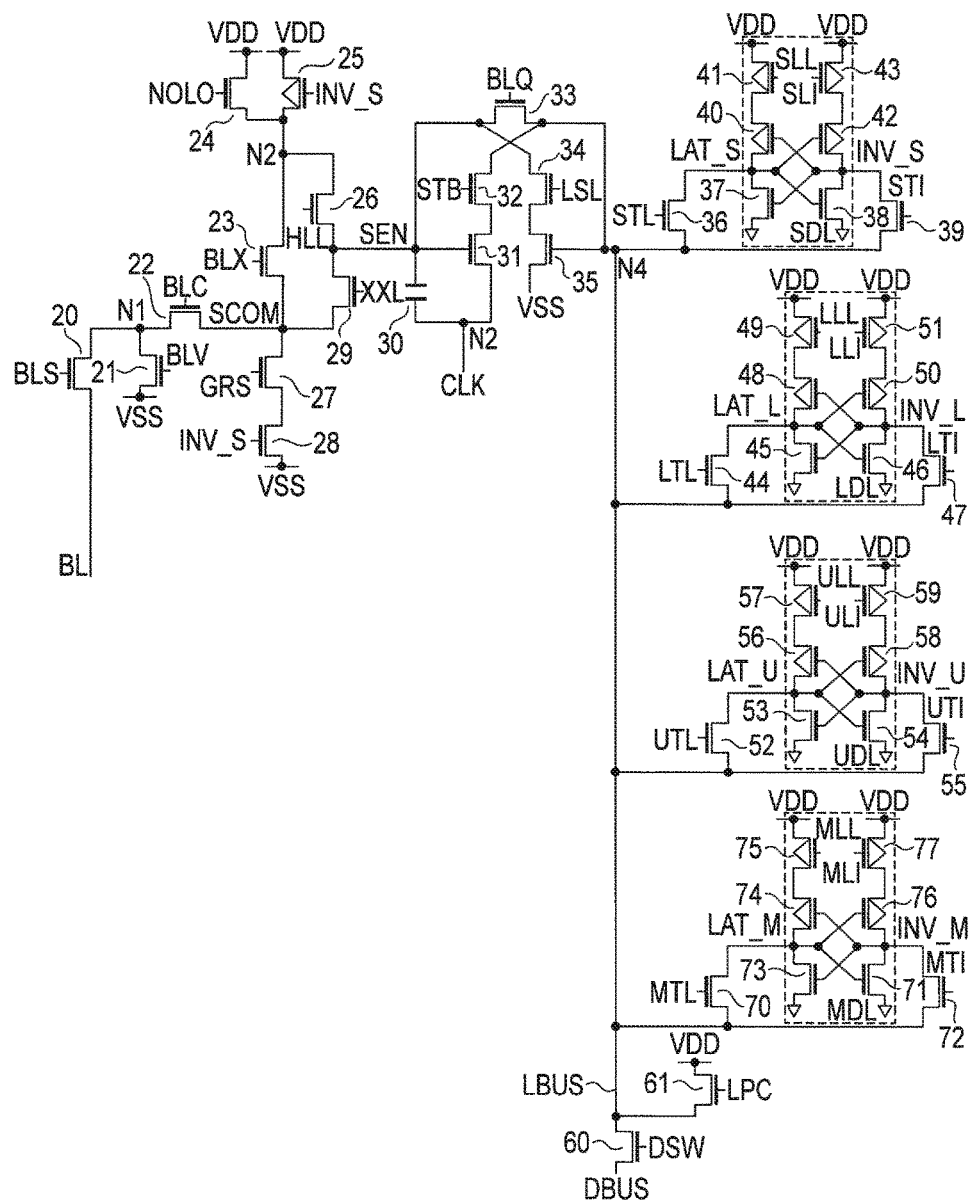
FIG. 8 is a diagram of a configuration example of a sense amplifier according to a modification.

As depicted in FIG. 8, the sense amplifier 3 according to the modification further includes MDL.

MDL holds middle bit data included in the three bits. For example, MDL holds "1" data when the voltage level of LAT_M is "H", and holds "0" data when the voltage level of LAT_M is "L".

As depicted in FIG. 8, MDL holds n-channel type MOS transistors 70 to 72 and p-channel type MOS transistors 74 to 77.

One end of the MOS transistor 70 is connected to a node N4, the other end of the MOS transistor 70 is connected to LAT_M, and a gate of the MOS transistor 70 is supplied with a signal MTL.

One end of the MOS transistor 72 is connected to the node N4, the other end of the MOS transistor 72 is connected to INV_M, and a gate of the MOS transistor 72 is supplied with a signal MTI.

One end of the MOS transistor 73 is connected to LAT_M, the other end of the MOS transistor 73 is grounded, and a gate of the MOS transistor 73 is supplied with INV_M.

Furthermore, one end of the MOS transistor 71 is connected to INV_M, the other end of the MOS transistor 71 is grounded, and a gate of the MOS transistor 71 is supplied with LAT_M.

One end of the MOS transistor 74 is connected to LAT_M along with the other end of the MOS transistor 73, and a gate of the MOS transistor 74 is supplied with INV_M.

One end of the MOS transistor 75 is supplied with the voltage VDD, and a gate of the MOS transistor 75 is supplied with the signal MLL.

Moreover, one end of the MOS transistor 76 is connected to INV_M along with the other ends of the MOS transistors 71, 72, and a gate of the MOS transistor 76 is supplied with LAT_M.

Moreover, one end of the MOS transistor 77 is supplied with the voltage VDD, and a gate of the MOS transistor 77 is supplied with the signal MLI.

The MOS transistors 71, 73, 74, and 76 form a latch circuit and can hold 1-bit data.

2. Conceptual Drawing of Data Holding

Now, FIGS. 9A to 9E are used to depict conceptual drawings illustrating that LDL, MDL, and UDL hold 3-bit data and conceptual drawings illustrating a voltage supply method based on a rise of the threshold distribution.

As depicted in FIG. 9A, when the threshold distribution is in E to C, the voltage level of LDL is "H", in contrast, when the threshold distribution is in D to G, the voltage level of LDL is "L".

When the threshold distribution is in E, A, F, and G, the voltage level of MDL is "H", in contrast, when the threshold distribution is in B to E, the voltage level of MDL is "L".

Moreover, when the threshold distribution is in E, C, D, and G, the voltage level of UDL is "H", in contrast, when the threshold distribution is in A, B, E, and F, the voltage level of UDL is "L".

As described above, 3-bit data is held by allowing LDL, MDL, and UDL to store 1-bit data.

Figure 9C:
FIG. 9C is a conceptual drawing of write voltages supplied by the sense amplifier based on a verify result according to the second embodiment.
Figure 9D:
FIG. 9D is a conceptual drawing of the write voltages supplied by the sense amplifier based on the verify result according to the second embodiment.

For such 3-bit data, the sense amplifier 3 supplies the voltages depicted in FIGS. 9C to 9E to the bit line BL based on the data held by LDL, MDL, and UDL.

That is, as depicted in FIG. 9C, for memory cells MC for which the target threshold distribution is in a state lower than the "C" state (except for the "E" state), the sense amplifier 3 supplies the voltage VQPWL to the bit line BL until the threshold distribution rises to the "C" state.

In contrast, for memory cells MC for which the target threshold distribution is in the "D" state or higher, the sense amplifier 3 supplies the voltage VSS to the bit line BL until the threshold distribution reaches the "C" state.

Moreover, as depicted in FIG. 9D, for memory cells MC for which the target threshold distribution is in the "D" state or higher, when the threshold distribution reaches the "C" state, the sense amplifier 3 supplies, based on the data held by MDL, the voltage VQPWL to the bit line BL for memory cells MC for which the target threshold distribution is in the "D" state and in the "E" state.

In contrast, for memory cells MC for which the target threshold distribution is in the "F" state and in the "G" state, the sense amplifier 3 supplies the voltage VSS to the bit line BL.

Moreover, as depicted in FIG. 9E, for memory cells MC for which the target threshold distribution is in the "E" state or higher, the voltage VQPWL is supplied for memory cells MC for which the threshold distribution is in the "F" state, and the voltage VSS is supplied for memory cells MC for which the threshold distribution is in the "G" state.

Second Embodiment

Now, a non-volatile semiconductor storage device according to a second embodiment will be described.

In the above-described embodiment, for example, for memory cells MC determined to be positioned in the region α or in the region β as a result of the write verify, the sense amplifier 3 supplies the voltage VQPWL or the voltage VQPWH to the bit line BL. However, the non-volatile semiconductor storage device according to the second embodiment is different from the non-volatile semiconductor storage device in the first embodiment in that the above-described four voltages including the voltage VQPWH and the voltage VQPWH are used to complete the threshold distribution in the "E" to "C" states, respectively.

1. Pattern 1

<For the "E" state: the voltage VDD, for the "A" state: the voltage VQPWL, for the "B", "C" states: VSS>

In a pattern 1, write data for the "B" and "C" states is stored in SDL, and write data for the "A" state is stored in LDL.

When the target threshold distribution is in the "A" state, the sense amplifier 3 applies the voltage VQPWL from LDL to the bit line BL to completely convert the threshold distribution from the "E" state to the "A" state without stopping.

Similarly, when the target threshold distribution is in the "B" state or "C" state, the sense amplifier 3 applies the voltage VSS to the bit line BL via the MOS transistors 28, 29, 22, and 20 to completely convert the threshold distribution from the "E" state to the "B" state or the "C" state without stopping.

Here, the write voltage VPGM is transferred to the selected word line WL by first supplying a high voltage to the selected word line WL and subsequently incrementing the voltage by ΔV as in voltage VPGM=>voltage (VPGM+ΔV)=>voltage (VPGM+ΔV×2=>voltage (VPGM+ΔV×3) . . . =>voltage (VPGM+ΔV×n).

2. Pattern 2

<For the "E" state: VDD, for the "A" state: the voltage VQPWL, for the "B" states: the voltage VQPWL, for the "C" state: VSS>

In a pattern 2, write data for the "C" state is stored in SDL, write data for the "A" state is stored in LDL, and write data for the "B" state is stored in UDL.

When the target threshold distribution is in the "A" state, the sense amplifier 3 applies the voltage VQPWH from LDL to the bit line BL to completely convert the threshold distribution from the "E" state to the "A" state without stopping.

Similarly, when the target threshold distribution is in the "B" state, the sense amplifier 3 applies the voltage VQPWL from UDL to the bit line BL to completely convert the threshold distribution from the "E" state into the "B" state without stopping.

Effects of the Second Embodiment

The non-volatile semiconductor storage device in the second embodiment enables the desired threshold distribution to be completed with a reduced number of writing operations than the non-volatile semiconductor storage device in the first embodiment.

This is because the sense amplifier 3 supplies the bit line BL with the four voltages (VSS, VQPWL, VQPWH, and VDD) corresponding to the respective threshold distributions (E state, A state, B state, and C state).

As described above, high-speed write can be achieved by using the four voltages for a purpose different from the purpose in the first embodiment.

In each embodiment, (1) for a read operation, a voltage applied to a word line selected for the read operation in the A state is, for example, between 0 V and 0.55 V. The present embodiment is not limited to this, and the voltage may be between 0.1 V and 0.24V, between 0.21 V and 0.31 V, between 0.31 V and 0.4 V, between 0.4 V and 0.5 V, or between 0.5 V and 0.55 V.

A voltage applied to a word line selected for the read operation in the B state is, for example, between 1.5 V and 2.3 V. The present embodiment is not limited to this, and the voltage may be between 1.65 V and 1.8 V, between 1.8 V and 1.95 V, between 1.95 V and 2.1 V, or between 2.1 V and 2.3 V.

A voltage applied to a word line selected for the read operation in the C state is, for example, between 3.0 V and 4.0 V. The present embodiment is not limited to this, and the voltage may be between 3.0 V and 3.2 V, between 3.2 V and 3.4 V, between 3.4 V and 3.5 V, between 3.5 V and 3.6 V, and between 3.6 V and 4.0 V.

The duration (tR) of the read operation may be, for example, between 25 μs and 38 μs, between 38 μs and 70 μs, or between 70 μs and 80 μs.

(2) The write operation includes a program operation and a verify operation as described above. For the write operation, besides the voltage between 15.0 V and 23.0 V described above, the following voltages may be used.

Specifically, a voltage first applied to a word line selected during the program operation is, for example, between 13.7 V and 14.3 V. The present embodiment is not limited to this, and the voltage may be between 13.7 V and 14.0 V or between 14.0 V and 14.6 V.

The voltage first applied to the selected word line when data is written to odd-numbered word lines may be different from the voltage first applied to the selected word line when data is written to even-numbered word lines.

When an ISPP (Incremental Step Pulse Program) is used for the program operation, a step-up voltage may be, for example, approximately 0.5 V.

A voltage applied to the unselected word lines may be, besides the above-described voltage between 7.0 V and 10.0 V, the following voltages.

Specifically, the voltage applied to the unselected word lines may be, for example, between 6.0 V and. 7.3 V. The present embodiment is not limited to this, and the voltage may be between 7.3 V and 8.4 V or 6.0 V or lower.

An applied pass voltage may be varied depending on whether the unselected word line is an odd-numbered word line or an even-numbered word line.

The duration (tProg) of the write operation may be, for example, between 1700 μs and 1800 μs, between 1800 μs and 1900 μs, or between 1900 μs and 2000 μs.

(3) For an erase operation, a voltage first applied to a well formed in an upper portion of a semiconductor substrate and above which the memory cells are arranged is, for example, between 12 V and 13.6 V. The present embodiment is not limited to this case, and the voltage may be, for example, between 13.6 V and 14.8 V, between 14.8 V and 19.0 V, between 19.0 V and 19.8 V, or between 19.8 V and 21 V.

The duration (tErase) of the erase operation may be, for example, between 3000 μs and 4000 μs, between 4000 μs and 5000 μs, or between 4000 μs and 9000 μs.

(4) For the structure of the memory cell, the memory cell has the charge storage layer arranged on the semiconductor substrate (silicon substrate) via a tunnel insulating film with a film thickness of 4 to 10 nm. The charge storage layer may have a stacked structure including an insulating film such as SiN or SiON having a film thickness of 2 to 3 nm and polysilicon having a film thickness of 3 to 8 nm. A metal such as Ru may be added to polysilicon. An insulating film may be provided on the charge storage layer. The insulating film has a silicon oxide film having a film thickness of 4 to 10 nm and sandwiched between a lower high-k film having a film thickness of 3 to 10 nm and an upper high-k film having a film thickness of 3 to 10 nm. The high-k film may be HfO and the like. Furthermore, the silicon oxide film may have a larger thickness than the high-k film. A control electrode having a film thickness of 30 nm to 70 nm is formed on the insulating film via a material for work function adjustment which has a film thickness of 3 to 10 nm. Here, the material for work function adjustment may be a metal oxide film such as TaO or a metal nitride film such as TaN. W or the like may be used as the control electrode.

Furthermore, an air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage device comprising:
 a memory cell array having memory cells which are arranged in a matrix along a bit line direction and a word line direction and each of which is capable of holding N-bit (N: natural number) data; and
 a sense amplifier comprising a first latch capable of temporarily holding information on a threshold distribution, a second latch capable of holding write data, and a third latch capable of holding, lower information of the N-bit data, the sense amplifier capable of supplying a first to a fourth voltages to each of the memory cells to write the data to the memory cell using the first to fourth voltages, wherein the sense amplifier supplies the first to third voltages to the memory cell based on information held by the second latch and the third latch, and then, based on a result of transfer of the information held by the first latch to the second latch, supplies the fourth voltage, the first voltage, or the third voltage to the memory cell.

2. The non-volatile semiconductor storage device according to claim 1, wherein the sense amplifier comprises:

a first transistor supplied with a non-selection voltage through one end of the first transistor and connected to the bit line at the other end of the first transistor; and a second transistor connected to the third latch at one end of the second transistor and connected to the bit line at the other end of the second transistor along with the other end of the first transistor, when the second latch holds a first result as the result, the first transistor supplies the fourth voltage lower than a write voltage inhibition voltage to the bit line, and when the second latch holds a second result as the result, the second transistor supplies the first voltage or the third voltage which is lower than the fourth voltage to the bit line based on the information held by the third latch.

3. The non-volatile semiconductor storage device according to claim 2, further comprising a control unit configured to control on and off timings for the first transistor and the second transistor, wherein, when the first transistor supplies the second voltage, the control unit switches a signal level supplied to a gate of the first transistor from a fifth voltage to a sixth voltage lower than the fifth voltage, and when the second transistor supplies the third voltage, the control unit switches the signal level supplied to a gate of the second transistor to a seventh voltage lower than the sixth voltage.

4. The non-volatile semiconductor storage device according to claim 3, wherein the N-bit threshold distribution includes a first state representing an erase state, and a second state, a third state, and a fourth state in order of increasing voltage, and the threshold distribution capable of being temporarily held by the first latch is positioned between a first verify voltage which is higher than the first state and lower than the second state and a second verify voltage which is higher than the first state and lower than the first verify voltage.

* * * * *